United States Patent [19]

Coccetti et al.

[11] Patent Number: 4,672,332

[45] Date of Patent: Jun. 9, 1987

[54] RC OSCILLATOR HAVING PLURAL DIFFERENTIAL THRESHOLD STAGES

[75] Inventors: Silvano Coccetti, Vittuone; Roberto Viscardi, Lissone; Silvano Gornati, Casorezzo, all of Italy

[73] Assignee: SGS Microelettronica S.p.A., Catania, Italy

[21] Appl. No.: 854,392

[22] Filed: Apr. 21, 1986

[30] Foreign Application Priority Data

Apr. 24, 1985 [IT] Italy ................. 20485 A/85

[51] Int. Cl.$^4$ ...................... H03K 3/023; H03K 3/282
[52] U.S. Cl. .................................... 331/111; 331/143; 331/153
[58] Field of Search .................... 331/111, 143, 153

[56] References Cited

U.S. PATENT DOCUMENTS 3,659,224  4/1972  Ball ........................................ 331/111
4,407,588  10/1983  Arichi et al. ....................... 331/111 X
4,590,444  5/1986  Wilcox ................................. 331/111

Primary Examiner—Siegfried H. Grimm
Attorney, Agent, or Firm—Guido Modiano; Albert Josif

[57] ABSTRACT

This high accuracy, RC oscillator, particularly for monitors, has different switch-over thresholds independent from such variable parameters as the saturating voltage of transistors, and has a high operating frequency. The oscillator comprises a capacitor having an output terminal, a capacitor power current source, and a control section. The control section is composed of a plurality of differential stages sharing a common input and each having an input connected to a different switch-over threshold. The control section further comprises a switch-over drive stage connected to the oscillator output terminal and to an input terminal thereof for controlling activation and deactivation of the different differential stages (and hence, of the respective associated thresholds) according to the signal present at the output and input terminals of the oscillator.

8 Claims, 7 Drawing Figures

Fig. 4.a

RC OSCILLATOR HAVING PLURAL DIFFERENTIAL THRESHOLD STAGES

BACKGROUND OF THE INVENTION

This invention relates to an RC oscillator.

Circuits intended for monitor applications require definitely superior performance as regards the operating frequency and accuracy of the signals which control sweeping than standard TV circuits. Consequently with such applications an RC oscillator stage with different switch-over thresholds is required which is adequately accurate and performs reliably.

Currently, as a triggerable oscillator, for use with circuits intended for monitor applications, a positive feedback differential amplifier is used. That oscillator comprises a capacitive element which is fed through a resistor, and a differential stage connected with one input thereof to a terminal of the capacitor and with a second input thereof to a point in the circuit at a variable voltage. In particular in the absence of an external control signal, the voltage of the second input varies between an upper threshold and a lower threshold, whereas in the presence of an appropriate external signal, the upper threshold voltage is reduced to vary the time when the capacitor discharge begins, thus obtaining a periodically varying output voltage whose frequency depends, inter alia, on the difference between the upper switch-over threshold and the intermediate one in the presence of the external trigger signal.

A known circuit of that type is shown in FIG. 1 by way of example, FIGS. 2a and 2b showing waveforms relating to some points in the circuit of FIG. 1. In detail, the oscillator comprises a capacitive element $C_1$ connected at one terminal thereof (where the output voltage $V_C$ is tapped) to a feed resistor $R_1$. The remainder of the circuit forms the oscillator control section, adapted to control and vary the durations of the charge and discharge phases of the capacitor, and therefore, to vary the oscillation frequency of the circuit. That control section comprises substantially a differential stage, generally designated with the reference numeral 1, consisting of four transistors $Q_1, Q_2, Q_3$ and $Q_4$. Such transistors, of the PNP type, are arranged such that the base of the transistor $Q_2$ is connected to the emitter of the transistor $Q_1$, and the base of the transistor $Q_3$ is connected to the emitter of $Q_4$. The emitters of $Q_2$ and $Q_3$ are connected to each other and to a bias current source $I_1$. The base of $Q_1$ is connected to the circuit output terminal, and the base of the transistor $Q_4$ is connected to the point $V_S$ whereat the threshold voltage is present which causes switching-over in the various operation phases of the circuit. The collectors of $Q_1$ and $Q_4$ are grounded, and the collectors of $Q_2$ and $Q_3$ are connected respectively to a diode-connected transistor $Q_7$ and to a transistor $Q_8$ forming a current mirror.

The control section further comprises a transistor $Q_5$ which maintains the discharge of $C_1$ and having the collector connected to $V_C$, the emitter connected to ground through a resistor $R_2$ and the base connected to the common point of the collectors of $Q_3$ and $Q_8$. Connected to the same point is the base of a further transistor $Q_6$ adapted to set the lower switch-over threshold of the circuit. The transistor $Q_6$ has the emitter grounded and the collector connected in an intermediate point of a voltage divider consisting of resistors $R_3, R_4, R_5$ and $R_6$. The circuit is completed by a transistor $Q_9$ to the base whereof trigger pulses $V_T$ are applied.

The operation of the circuit of FIG. 1 is as follows. In the absence of a trigger pulse $V_T$, the transistor $Q_9$ is off. Consequently, the threshold switch-over voltage $V_S$ depends on the state of the transistor $Q_6$. In particular with the transistor $Q_6$ off, an upper threshold voltage is obtained:

$$V_{S'} = \frac{V_{cc} \cdot (R_4 + R_5 + R_6)}{R_3 + R_4 + R_5 + R_6}$$

whilst with the transistor $Q_6$ saturated, the lower threshold voltage is given by:

$$V_L = \frac{(V_{cc} - V_{6sat})}{R_3 + R_4} \cdot R_4 + V_{6sat}$$

on the contrary, in the presence of the trigger pulse $V_T$, the transistor $Q_9$ is saturated and the upper threshold voltage $V_S$ is given by:

$$V_{S''} = \frac{(V_{cc} - V_{9sat})(R_5 + R_4)}{R_3 + R_4 + R_5} + V_{9sat}$$

Let us assume than that the trigger pulse $V_T$ is absent and the capacitor $C_1$ is discharged ($V_C=0$). Consequently, the transistors $Q_1, Q_2, Q_7$ and $Q_8$ are conducting, whereas the transistors $Q_3, Q_4, Q_5$ and $Q_6$ are off. In this phase, on the base of $Q_4$ there is present the upper threshold voltage $V_{S'}$. Consequently, the capacitor $C_1$ begins to become charged through the resistor $R_1$ until it reaches the switch-over threshold $V_{S'}$, on exceeding which the transistors $Q_1$ and $Q_2$ turn off, whereas the transistors $Q_3$ and $Q_4$ switch into conduction. Consequently, the current mirror $Q_7$ and $Q_8$ switches off and the collector current $Q_3$ brings $Q_5$ into conduction (which thus causes the fast discharge of the capacitor) as well as $Q_6$ (which sets the lower threshold $V_L$). Then, the capacitor begins the discharge until the voltage $V_C$ again reaches the lower switch-over threshold $V_L$. On reaching that threshold, the transistors $Q_3$ and $Q_4$ switch off, $Q_1$ and $Q_2$ go into conduction activating the current mirror $Q_8$ and $Q_9$ which causes $Q_5$ and $Q_6$ to switch off. From this time on the cycle is repeated as previously described.

When at the base of the transistor $Q_9$, one or more trigger pulses $V_T$ are applied, the transistor $Q_9$ goes into conduction and, therefore, the threshold voltage $V_S$ at the base of $Q_4$ drops to the value determined by $V_{S''}$. Therefore the discharge of $C_1$ is no more triggered by $V_{S'}$, but occurs at the positive edge of the trigger pulse. The resulting output voltage of the known oscillator is shown in FIG. 2a in dependence on the trigger voltage $V_T$.

While commonly employed, the device just described has some drawbacks. In fact, since the low switch-over threshold $V_L$ depends on the saturating voltage $V_{CE\,6\,sat}$, the amplitude of the resulting waveform $V_C$ and hence the free frequency $f_o$ of the output signal are dependent on the process tolerances and vary as the operating temperature varies. Consequently, the circuit has not the desired accuracy.

Another disadvantage of the circuit according to the prior art resides in that during charging of $C_1$ the transistors $Q_1$ and $Q_2$ are conducting and the base delivered current is supplied to the capacitor $C_1$, adding to the charge current set through $R_1$. Since the base current of $Q_1$ is variable due to the differences in tolerance of the value of $\beta$ and the different operating temperatures, the circuit presents an error on the desired free frequency $f_o$.

Finally, not to be neglected is the fact that, owing to the use of PNP transistors to control switching between the charge and discharge phases of the capacitor, and in view of the intrinsic speed limitations of transistors of that type, the maximum operating frequency is restricted to set values.

SUMMARY OF THE INVENTION

Therefore, the aim of this invention is to provide an oscillator stage, particularly for monitors, which can solve the problems posed by the prior art, and in particular be adequately accurate in operation.

It is a particular object of this invention to provide an oscillator stage having threshold values which are independent of such variable parameters as the saturating voltage of transistors, the transistor amplification value, or the operating temperature.

Another object of this invention is to provide an oscillator the operating frequency whereof can be greatly increased over that obtainable with the prior art circuits, and in particular is not limited by the use of PNP transistors and saturating elements.

A further object of this invention is to provide an oscillator stage which can be manufactured in conformity with techniques of the usual type, and in particular be integrated within a reduced area.

A not least object of this invention is to provide an oscillator stage which has moderate manufacturing costs, and in particular comparable with those of known devices.

The above aim, and these and other objects to become apparent hereinafter, are achieved by an RC oscillator with different switch-over threshold, comprising a capacitive element connected to an oscillator output terminal, a current source feeding said capacitive element, and a differential control section connected to said capacitive element for setting different switch-over thresholds at which said capacitive element alternatively begins charging and discharging, characterized in that said control section comprises a plurality of differential stages, each differential stages defining first and second inputs as well as first and second control terminals, said first inputs of said differential stages being connected together and to said oscillator output terminal, said second inputs of said differential stages being connected each to a different point in said differential control section at a different reference voltage, said differential stages switching over between a first and a second state according to the voltage difference between said first and second inputs, said control section further comprising a drive section interposed between said first and second control terminals of said differential stages and having switching means responsive to said first and second switching-over state of said differential stage for selectively activating and deactivating said differential stages according to said oscillator output voltage.

BRIEF DESCRIPTION OF THE DRAWINGS

Further features and advantages will be more clearly apparent from the description of a preferred but not exclusive embodiment, shown by way of illustration but not of limitation in the accompanying drawings, where:

FIGS. 4a and 4b show the patterns of electric signals tapped at appropriate points in the circuit of FIG. 3.

Figure 1:
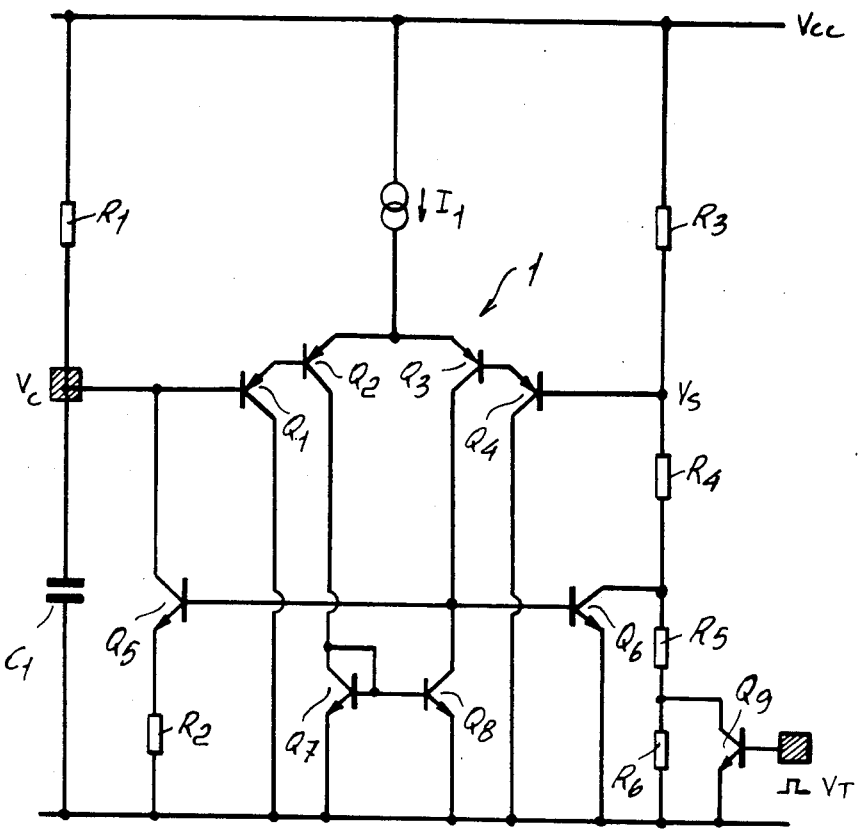
FIG. 1 shows a schematical circuit diagram of a device according to the state of art.
Figure 2A:
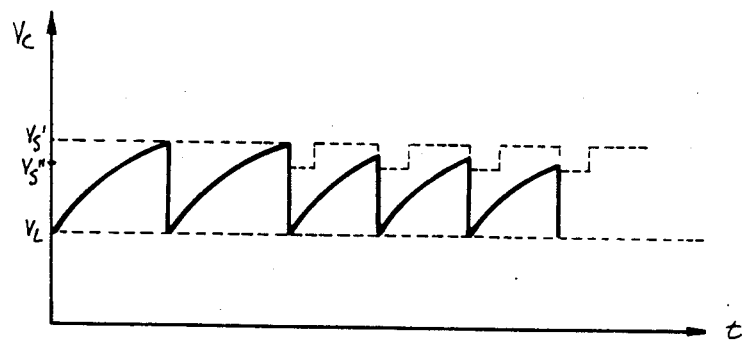
FIGS. 2a and 2b show waveforms relating to electric signals tapped on the known circuit of FIG. 1.
Figure 2B:
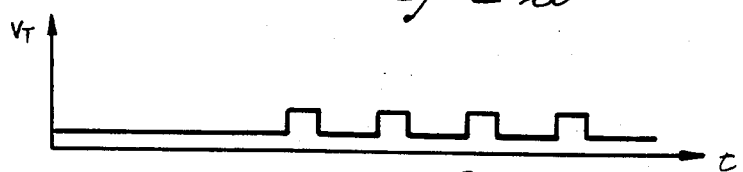

Only FIGS. 3, 4a, 4b and 5 will be discussed hereinafter because FIGS. 1, 2a, 2b have been already explained.

Figure 3:
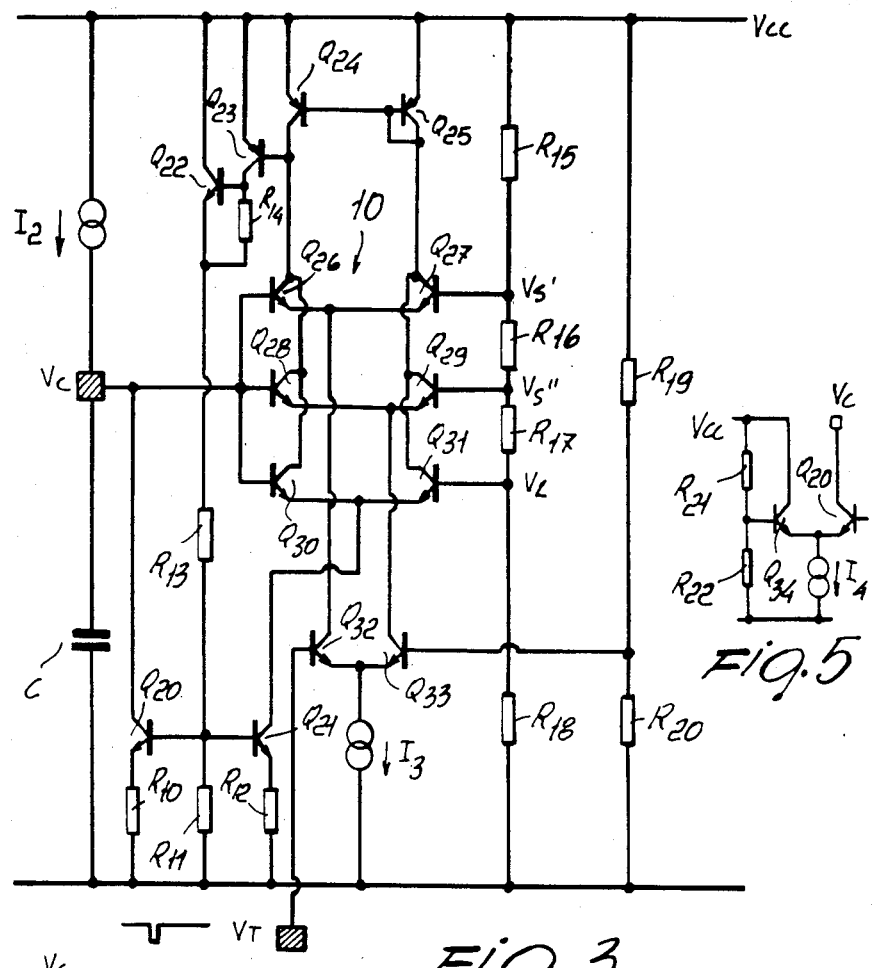
FIG. 3 shows a schematical circuit diagram of an oscillator stage according to the invention.
Figure 4B:
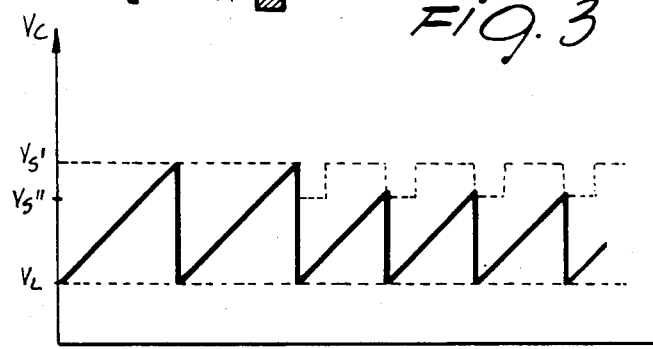
Figure 4B:
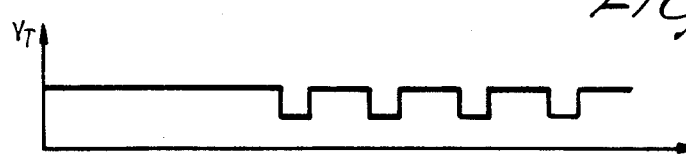

Making, therefore, reference to FIG. 3, the oscillation stage of this invention comprises substantially a capacitive element C, a power supply source $I_2$, and a control section forming the remainder of the circuit. That control section comprises three pairs of NPN transistors forming a first differential stage $Q_{26},Q_{27}$, a second differential stage $Q_{28},Q_{29}$, and a third differential stage $Q_{30},Q_{31}$. The differential stages have an input connected in common to the oscillator output terminal $V_C$, whilst the other inputs of the differential stages are connected to different threshold voltages $V_{S'},V_{S''},V_L$. These reference voltages are fixed in that they are tapped on a resistive divider consisting of resistors $R_{15},R_{16},R_{17}$ and $R_{18}$. Furthermore, the collectors of the transistors $Q_{26}, Q_{28},Q_{30}$ are connected together and to a transistor $Q_{24}$ of a current mirror comprising the diode-connected transistor $Q_{25}$ as well and being connected to the collectors of the transistors $Q_{27},Q_{29}$, and $Q_{31}$. The collectors of the transistors $Q_{26},Q_{28}$, and $Q_{30}$ are also connected to the base of a transistor $Q_{23}$ belonging to a drive section comprising also the transistor $Q_{22}$, resistors $R_{14},R_{13},R_{10},R_{11}$ and $R_{12}$, and the transistors $Q_{20}$ and $Q_{21}$. In particular $Q_{20}$ is connected at its collector terminal to the output terminal of the oscillator stage and represents, therefore, the element adapted to allow discharge of the capacitor C at appropriate times, whilst the collector of the transistor $Q_{21}$ is connected to the emitters of the differential stage $Q_{30}, Q_{31}$ so as to allow powering thereof during the capacitor discharge, and hence setting of the low switch-over threshold. The control section also comprises a further differential stage $Q_{32},Q_{33}$ for powering the differential stage $Q_{26},Q_{27}$ or the differential stage $Q_{28},Q_{29}$ depending on the absence or presence of the trigger pulse $V_T$. To this aim, the collector of $Q_{32}$ is connected to the emitters of $Q_{26},Q_{27}$, whilst the collector of $Q_{33}$ is connected, to the emitters of $Q_{28},Q_{29}$. Furthermore, the emitters of $Q_{32}$ and $Q_{33}$ are connected to a bias current source $I_3$, whilst the base of $Q_{33}$ is connected to a voltage divider formed of resistors $R_{19}$ and $R_{20}$ so as to have a fixed reference voltage.

The operation of the circuit according to the invention is as follows. In the absence of the (negative) trigger pulse $V_T$, the voltage existing between the transistors $Q_{32}$ and $Q_{33}$ is such as to hold the transistor $Q_{32}$ in conduction and the transistor $Q_{33}$ off. Consequently, the differential stage formed by $Q_{26}$ and $Q_{27}$ is fed by the current $I_3$, whereas the differential stage $Q_{28},Q_{29}$ is off. Therefore, during the charging phase of the capacitor C, $Q_{26}$ is off, whereas the transistors $Q_{27},Q_{25}$ and $Q_{24}$ are on, holding the transistors $Q_{23},Q_{22},Q_{20}$ and $Q_{21}$ off. Thus, the oscillator remains in the capacitor charging state and only the differential stage $Q_{26},Q_{27}$ connected to the upper switch-over voltage $V_{S'}$ is active. Consequently, the capacitor continues charging through the source $I_2$ until the output voltage $V_C$ reaches the upper switch-over threshold $V_{S'}$. At that time, transistor $Q_{26}$ turns on, whereas $Q_{27}$ goes off. The off state of $Q_{27}$ also causes $Q_{24}$ and $Q_{25}$ to switch off, whilst switching of $Q_{26}$ into conduction brings about turning on of $Q_{23}$, $Q_{22}$, $Q_{20}$ and $Q_{21}$. With $Q_{20}$ activated, the capacitor C can, therefore, discharge rapidly, thereby the output voltage $V_C$ moves through its substantially vertical descending front, as shown in FIG. 4a on the left. The conduction of $Q_{21}$ brings about feeding of the differential stage formed by $Q_{30}$, $Q_{31}$, thus activating the stage connected to the low switch-over voltage. In that phase $Q_{30}$ is conducting, whereas $Q_{31}$ is off until the output voltage $V_C$ reaches the low switch-over threshold $V_L$.

As soon as the discharge of the capacitor C begins, $Q_{26}$ turns off, whereas $Q_{27}$, $Q_{25}$ and $Q_{24}$ becomes conducting; consequently, $Q_{22}$ and $Q_{23}$ would be cut off should $Q_{30}$, fed by a larger current than that feeding $Q_{26}$, not confirm the conducting state for $Q_{22}$, $Q_{23}$, $Q_{20}$ and $Q_{21}$, thus maintaining C in its discharge state until the lower threshold $V_L$ is reached.

As soon as the output voltage reaches the lower switch-over value, $Q_{30}$ turns off, $Q_{31}$ becomes conducting, thus cutting off $Q_{20}$,$Q_{21}$,$Q_{22}$,$Q_{23}$. From now on the capacitor begins to recharge itself and the output voltage follows the rising sloping section shown in FIG. 4a.

If during that operation stage, on the base of $Q_{32}$ there is applied a trigger pulse $V_T$, $Q_{32}$ turns off, whereas $Q_{33}$ goes into conduction so as to no longer feed the differential stage $Q_{26}$,$Q_{27}$, and to feed instead the differential stage $Q_{28}$,$Q_{29}$. Consequently, the latter, connected to the intermediate switch-over voltage $V_{S''}$, replaces the differential stage $Q_{26}$, $Q_{27}$ connected to the upper switch-over threshold $V_{S'}$. Consequently, the circuit continues to operate in conformity with the operation already described hereinabove, with the difference that the discharge of the capacitor C is no longer controlled by the threshold $V_{S'}$, but by the negative front of the trigger pulse, as visible in FIGS. 4a, 4b, on the right portion.

As may be appreciated from the foregoing description, the invention fully achieves the objects set forth. In fact, an oscillator stage has been provided wherein the switch-over thresholds no longer depend on the saturation voltages of some transistors, but are determined by the values of the resistive elements $R_{15}$,$R_{16}$,$R_{17}$ and $R_{18}$. Consequently, the switch-over thresholds can be set in a very accurate and precise manner, thus obtaining a very accurate operation of the oscillator circuit itself.

The fact that during the capacitor C charge phase the transistors $Q_{26}$,$Q_{28}$,$Q_{30}$, connected directly to the capacitor itself, are off, causes the single current which brings about charging of the capacitor to be that due to the source $I_2$, so that no errors can be had due to variations in the value of $\beta$ owing to manufacturing tolerances or to the operating temperature.

The use, to obtain the differential stages, of just transistors of the NPN type confers on the circuit a higher speed of switching over, thanks to the improved speed characteristics of these elements. Lastly, the fact should not be ignored that the embodiment presented allows integration of transistors $Q_{26}$,$Q_{28}$, and $Q_{30}$ and of the transistors $Q_{27}$,$Q_{29}$, and $Q_{31}$ in but two epitaxial pockets, thus obtaining a favorable saving in area as concerns the device manufacturing costs.

The invention herein is susceptible to many modifications and variations, all falling within the scope of the inventive concept. In fact, using the same solutive idea, it is possible to provide further intermediate switch-over thresholds, suitably driven by appropriate switch-over sections or even by a single switch-over section having more control outputs. Furthermore, it is possible to design the circuit in order that the trigger pulse causes switching over between the lower threshold voltage and a further intermediate threshold, rather than between the upper threshold and an intermediate threshold.

Figure 5:
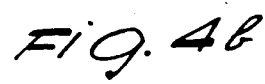
FIG. 5 shows a variation of a detail of the circuit of FIG. 3.

FIG. 5 shows a further possible variation to be used where a controlled discharge current and a triangular output voltage, instead of a sawtooth one, are desired with any ratio of the charging time to the discharging time. To that end, it is sufficient to replace the resistor $R_{10}$ on the emitter of $Q_{20}$ with the components shown in FIG. 5, the remainder of the circuit being left unaltered. In detail, the emitter of $Q_{20}$ (the collector and base whereof are connected to the remainder circuit, as in FIG. 3) is connected to a current source $I_4$ and to the emitter of a further transistor $Q_{34}$ the collector whereof is connected to the power supply voltage and the base whereof is connected to an intermediate tap of a voltage divider formed by the resistors $R_{21}$ and $R_{22}$ placed between the power supply and ground. Consequently, as the capacitor begins its discharge through $Q_{20}$, the flowing current, and hence the discharge rate, are governed by $I_4$, which is settable at will. The transistor $Q_{34}$ operates here as a voltage compensated threshold for the operation of $Q_{20}$ so as to set in a reliable way the time when the latter becomes conducting. Furthermore, the transistor $Q_{34}$ prevents saturation of the transistor forming the source $I_4$, which saturation would involve speed and accuracy problems as already mentioned and which it is intended to avoid with this invention. In fact, at the end of the discharge of C, $Q_{34}$ acts for holding the source $I_4$ in dynamic situation, with the current $I_4$ flowing through $Q_{34}$ instead of through $Q_{20}$.

Furthermore, all the details may be replaced with other technically equivalent ones.

We claim:

1. An RC oscillator comprising a capacitive element having at least one terminal forming an oscillator output terminal supplying an oscillator output voltage, a current source connected to said terminal of said capacitive element for feeding said capacitive element, and a differential control section connected to said capacitive element terminal, said differential control section comprising a plurality of differential stages, each differential stage defining first and second inputs as well as first and second control terminals, said first inputs of said differential stages being connected together and to said oscillator output terminal, said second inputs of said differential stages being connected each to a different point in said differential control section at a different reference voltage, said differential stages switching over between a first and a second state according to the voltage difference between said first and second inputs, said control section further comprising a drive section interposed between said first and second control terminals of said differential stages and having switching means responsive to said first and second switching-over states of said differential stages for selectively activating and deactivating said differential stages according to said oscillator output voltage.

2. An oscillator according to claim 1, wherein said control section further comprises a switch-over element having at least one control input and at least two drive terminals, said drive terminals being respectively connected to a first and to a second differential stage of said plurality for the selective actuation of one of them in dependence on the value of an external control signal fed to said switch-over element at said control input.

3. An oscillator according to claim 1, wherein said control section comprises two extreme threshold differential stages forming an upper threshold differential stage and a lower threshold differential stage, at least one intermediate threshold differential stage and at least one intermediate threshold switch-over stage, said intermediate threshold switch-over stage having one control input and two drive terminals, said drive terminals being respectively connected to said intermediate threshold differential stage and to one of said extreme threshold differential stages for the selective actuation thereof in dependence on the value of an external control signal fed to said intermediate threshold switch-over stage at said control input.

4. An oscillator stage according to claim 3, wherein said intermediate threshold switch-over stage comprises a further differential stage having a pair of transistors base connected respectively to said second control input and to a fixed voltage, the collector terminals of said transistor pair being connected to said intermediate threshold differential stage and said one of said extreme threshold differential stages.

5. An oscillator according to claim 3, wherein said intermediate threshold switch-over section comprises a pair of transistors having collector terminals connected respectively to said upper threshold differential stage and to said intermediate threshold differential stage.

6. An oscillator stage according to claim 1, wherein said control section comprises two extreme threshold differential stages forming an upper threshold differential stage and a lower threshold differential stage, at least one intermediate threshold differential stage and a drive stage, said drive stage comprising a setting section for setting said lower threshold differential stage, said setting section having a switching input connected to said upper and said intermediate threshold differential stages and a feeding output connected to said lower threshold differential stage thereby activating said lower threshold differential stage on the signal present on said output terminal reaching the set upper or intermediate threshold and either said upper or said intermediate threshold differential stage switches over.

7. An oscillator stage according to claim 1, wherein said differential stages comprise transistors of the NPN type.

8. An oscillator stage according to claim 1, wherein said different points at said different voltages are tapped on a resistive divider.

* * * * *